(12) United States Patent
Miu et al.

(10) Patent No.: US 7,668,009 B2
(45) Date of Patent: *Feb. 23, 2010

(54) METHOD OF DECREASING PROGRAM DISTURB IN MEMORY CELLS

(75) Inventors: Kenneth Miu, Fremont, CA (US); Leong Seng Tan, Shanghai (CN); Can Zhong, Shanghai (CN); Jianchang Liu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 81 days.

This patent is subject to a terminal disclaimer.

(21) Appl. No.: 11/874,902

(22) Filed: Oct. 18, 2007

(65) Prior Publication Data

US 2008/0151666 A1  Jun. 26, 2008

(51) Int. Cl.
*G11C 11/34* (2006.01)
(52) U.S. Cl. .............. 365/185.03; 365/185.18; 365/185.21; 365/185.24; 365/185.29; 365/185.33
(58) Field of Classification Search .......... 365/185.03, 365/185.18, 185.21, 185.22, 185.24, 185.28, 365/185.29, 185.33
See application file for complete search history.

(56) References Cited

U.S. PATENT DOCUMENTS

| | | | | |
|---|---|---|---|---|
| 5,359,558 A * | 10/1994 | Chang et al. | ............. | 365/185.3 |
| 5,805,499 A * | 9/1998 | Haddad | ............. | 365/185.18 |
| 6,469,933 B2 * | 10/2002 | Choi et al. | ............. | 365/185.18 |
| 6,966,016 B2 * | 11/2005 | Naksrikram et al. | ........ | 365/201 |
| 7,161,833 B2 * | 1/2007 | Hemink | ............. | 365/185.18 |
| 7,221,603 B2 * | 5/2007 | Roohparvar | ............. | 365/201 |
| 7,224,628 B2 * | 5/2007 | Yang et al. | ............. | 365/201 |
| 7,286,406 B2 * | 10/2007 | Lutze et al. | ............. | 365/185.18 |
| 7,319,615 B1 * | 1/2008 | Park et al. | ............. | 365/185.22 |
| 7,440,326 B2 * | 10/2008 | Ito | ............. | 365/185.18 |
| 7,471,566 B2 * | 12/2008 | Hemink | ............. | 365/185.18 |
| 7,489,542 B2 * | 2/2009 | Chen et al. | ............. | 365/185.03 |
| 7,492,634 B2 * | 2/2009 | Li et al. | ............. | 365/185.03 |
| 2008/0151667 A1 * | 6/2008 | Miu et al. | | |

* cited by examiner

*Primary Examiner*—Trong Phan
(74) *Attorney, Agent, or Firm*—Squire, Sanders & Dempsey, L.L.P.

(57) ABSTRACT

The present invention provides a method of decreasing program disturb in memory cells, comprising: finding an initial programming condition that ensure programming memory cell normally; selecting one parameter from the initial programming condition as a variable for the program disturb test; performing the program disturb test to the memory cell for at least two values of the variable; obtaining a programming condition with minimum program disturb based on the result of the program disturb test; and applying the programming condition with minimum program disturb as the programming condition for memory cell. The method according to the present invention can minimize the program disturb for the memory cell and can be performed easily.

8 Claims, 5 Drawing Sheets

METHOD OF DECREASING PROGRAM DISTURB IN MEMORY CELLS

This application claims the priority of Chinese Patent Application No. 200610147708.5, filed Dec. 21, 2006, the entire disclosure of which is incorporated herein by reference.

FIELD OF THE INVENTION

The present invention relates to semiconductor memory cell, and in particular to a method of decreasing program disturb in memory cells.

BACKGROUND OF THE INVENTION

Non-volatile memory device consists of memory cell array including word lines and bit lines. In general, FET (field effect transistor) is a basic element of the memory cell. The word line connects gates of the transistors and the bit line connects drains of the transistors. A programming operation for a selected memory cell can be performed by floating certain word line and bit line. However, when it is desired to program the selected memory cell during application, the unselected memory cells connected to the same word line and adjacent to the selected memory cell may be programmed also. Such a phenomenon is called "program disturb".

The U.S. Pat. No. 6,469,933 discloses a method of decreasing program disturb in memory cells. When memory cell array is programmed, a ground voltage is applied to the bit line of the memory cell to be programmed, while a high voltage is applied to the bit line of the adjacent memory cells needless to be programmed, thus forming a complementary bit line to decrease the program disturb. The basic principle of the above method is to decrease program disturb by controlling the programming operation of memory cell. Thus, it is necessary to control not only the bit line voltage of the memory cell needed to be programmed, but also a bit line voltage of memory cells needless to be programmed. Therefore, it is not easy to operate.

SUMMARY OF THE INVENTION

An object of the present invention is to provide a method of decreasing program disturb in memory cells easily.

The embodiments of the present invention provide a method of decreasing the program disturb in memory cells, comprising:

finding an initial programming condition that ensures programming a memory cell normally;

selecting one parameter from the initial programming condition as a variable for a program disturb test;

performing the program disturb test to the memory cell for at least two values of the variable;

obtaining a programming condition with minimum program disturb based on a result of the program disturb test; and applying the programming condition with minimum program disturb as programming condition during programming the memory cell.

The present invention has following advantages over the prior art: the program disturb is minimized by obtaining the programming condition with minimum program disturb according to the result of the program disturb test, and then applying the programming condition with minimum program disturb on the premise of programming the memory cell normally; and such an operation is very easy because no additional control is required during the programming.

DETAILED DESCRIPTION OF THE EMBODIMENTS

Figure 4:
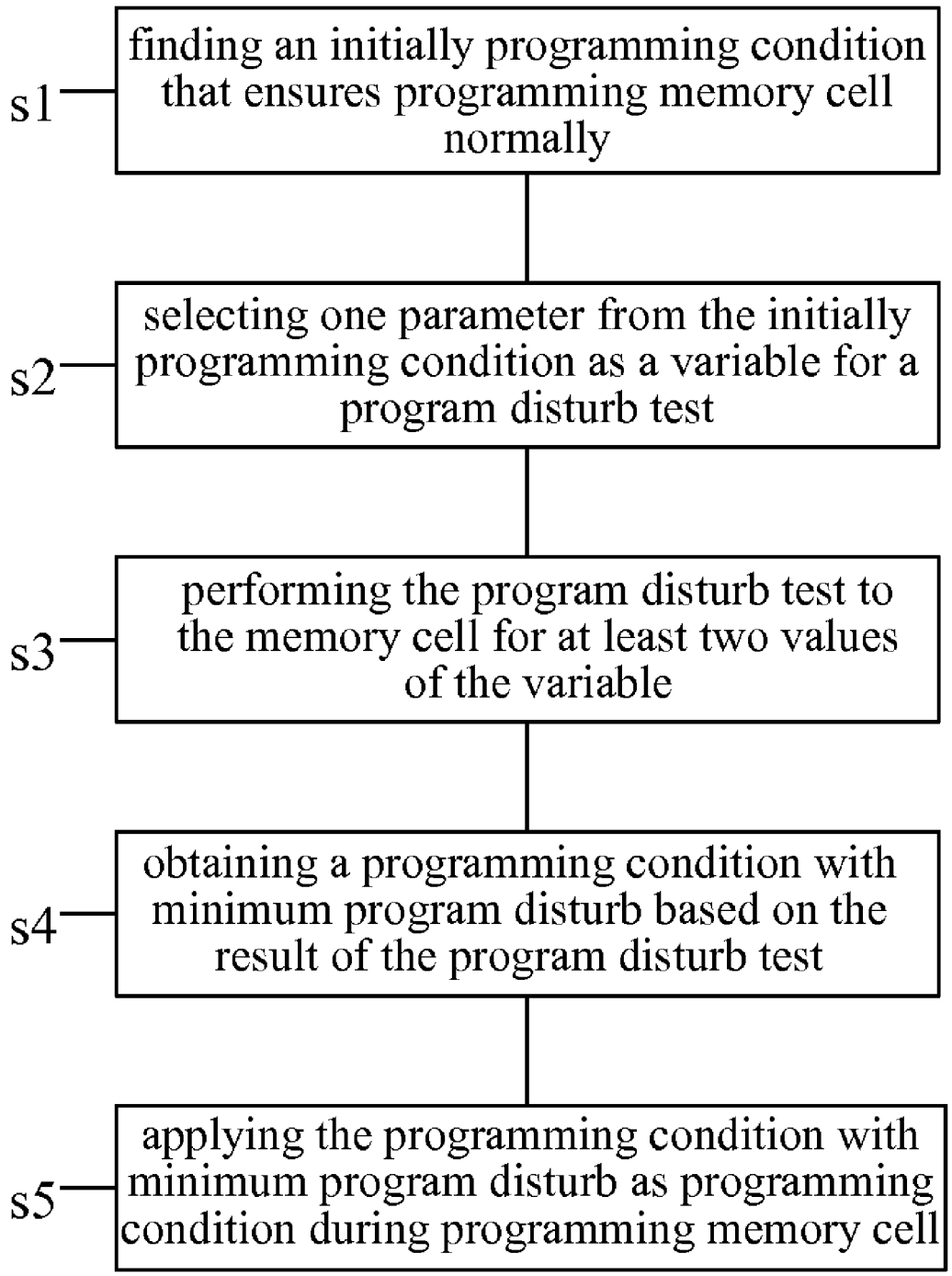
FIG. 4 is a flow chart showing a method of decreasing the program disturb in memory cells according to an embodiment of the present invention.

A method of decreasing the program disturb in memory cells according to the invention can minimize program disturb in memory cells during programming a memory cell by obtaining a programming condition with minimum program disturb through a program disturb test, and then applying the programming condition with minimum program disturb to the memory cell during programming, comprising, as shown in FIG. 4:

finding an initial programming condition that ensures programming memory cell normally at step s1;

selecting one parameter from the initial programming condition as a variable for a program disturb test at step s2;

performing the program disturb test to a memory cell for at least two values of the variable at step s3;

obtaining a programming condition with minimum program disturb based on the result of the program disturb test at step s4; and applying the programming condition with minimum program disturb as programming condition during programming memory cell at step s5.

Figure 5:
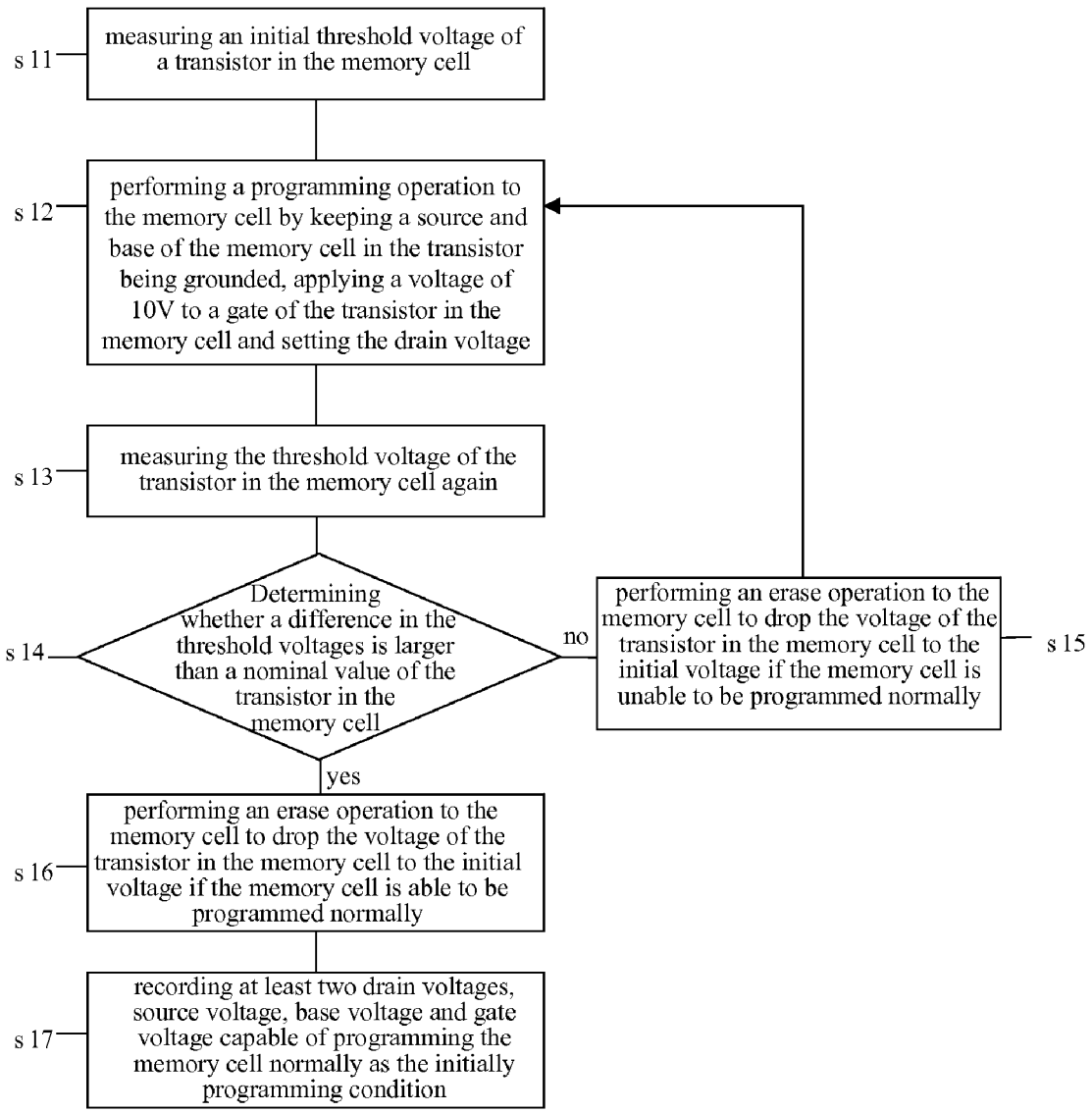
FIG. 5 is a flow chart showing a method of finding the initial programming condition that can ensure programming a memory cell normally.

The step of finding an initial programming condition that ensures programming memory cell normally includes the following steps, as shown in FIG. 5:

measuring an initial threshold voltage of a transistor in the memory cell at step s11;

programming the memory cell by keeping source and base of the transistor in the memory cell being grounded, applying a voltage of 10V to gate of the transistor in the memory cell and setting the drain voltage at step s12;

measuring the threshold voltage of the transistor in the memory cell again at step s13;

determining whether a difference in the threshold voltages is larger than a nominal value of the transistor in the memory cell at step s14;

at step s15, performing an erase operation to the memory cell to drop the voltage of the transistor in the memory cell to the initial voltage if the difference in the threshold voltages is smaller than the nominal value and hence the memory cell is unable to be programmed normally, and then returning to step s12;

at step s16, performing an erase operation to the memory cell to drop the voltage of the transistor in the memory cell to the initial voltage if the set drain voltage reaches the nominal value and hence the memory cell is able to be programmed normally;

recording at least two drain voltages, source voltage, base voltage and gate voltage capable of programming the memory cell normally as the initial programming condition at step s 17.

Preferably, the nominal value is 2.5V.

Preferably, the drain voltage at which the memory cell can be programmed normally is 3.6V, 3.8V, 4.0V, 4.2V and 4.4V.

Preferably, the initial programming condition is as follows: the source and base of the transistor in the memory cell are grounded, a voltage of 10V is applied to the gate, and a voltage of 3.6V, 3.8V, 4.0V, 4.2V or 4.4V is applied to the drain.

Figure 6:
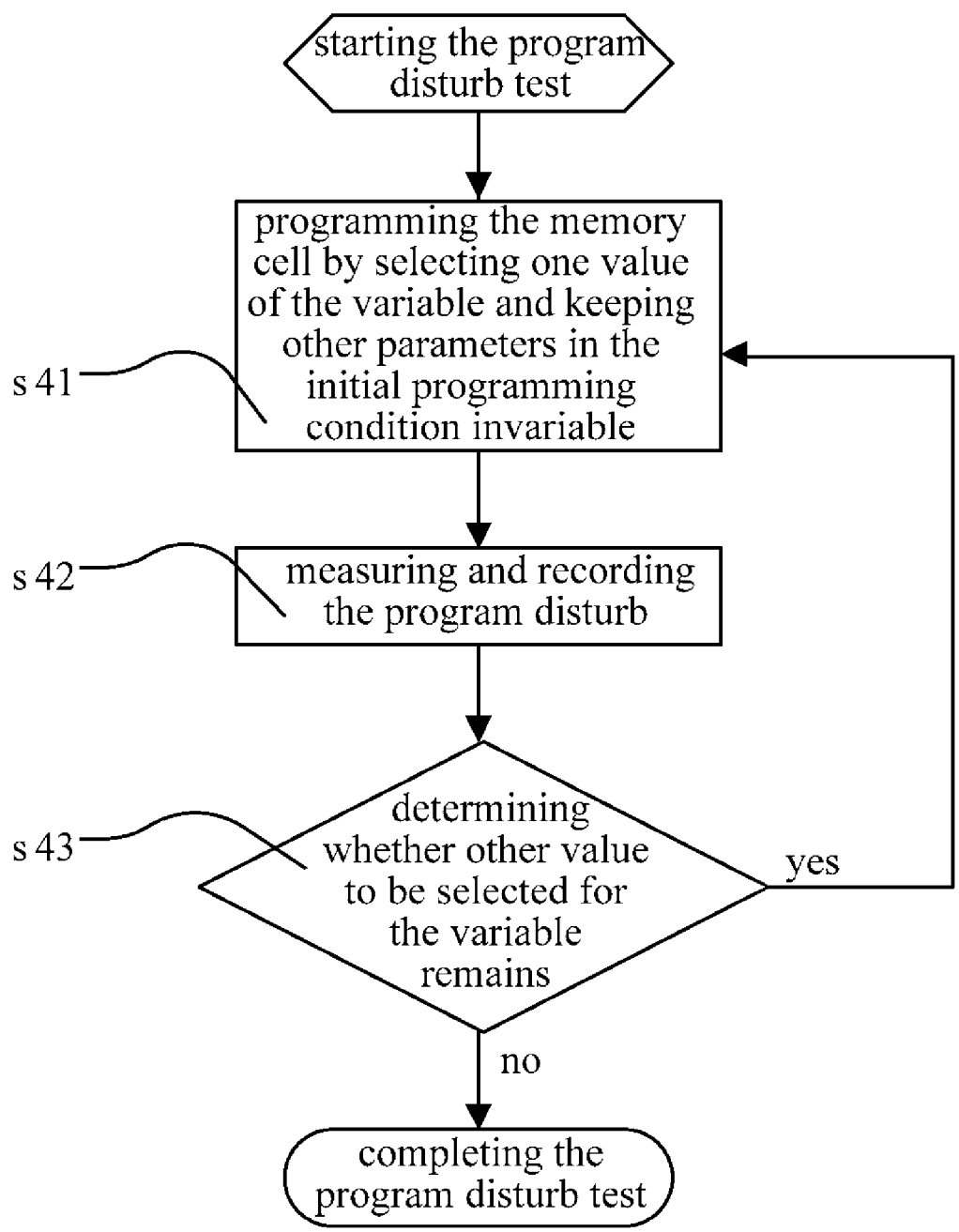
FIG. 6 is a flow chart showing the program disturb test.

The program disturb test includes the following steps as shown in FIG. 6:

programming the memory cell by setting a value to the variable and keeping other parameters in the initial programming condition invariable at step s41;

measuring and recording the program disturb at step s42;

determining whether other value to be set to the variable remains at step s43;

returning to step s41 if other value to be set to the variable remains;

otherwise, completing the disturb test.

The programming condition with minimum program disturb is a set of values corresponding to each parameter capable of minimizing the program disturb in the memory cell.

The source voltage or the base voltage is selected from the initial programming condition as the variable.

The source voltage is set to floating, 1V, 1.5V or 2V and the base voltage is set to −1V, 0V or 1V.

A method for decreasing program disturb in memory cells according to the present invention will be described in detail below, as shown in FIG. 4.

Figure 1:
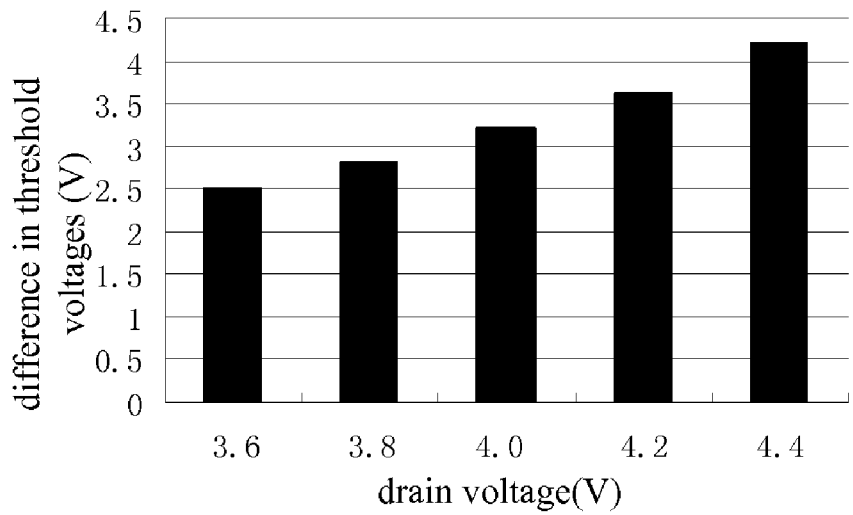
FIG. 1 is a histogram illustrating a result of finding an initial programming condition that can ensure programming memory cell normally according an embodiment of the present invention.

In the first stage, an initial programming condition that can ensure programming the memory cell normally is found as show in FIG. 5, in which:

firstly, measuring an initial threshold voltage of the transistor in the memory cell;

then, applying a voltage of 10V to the gate of the transistor in the memory cell and setting the drain voltage as 3.6 while keeping the source and the base being grounded, so as to perform a programming operation to the memory cell;

measuring the threshold voltage of the memory cell again after completing the programming operation;

obtaining a difference in the threshold voltages by subtracting the initial threshold voltage from the threshold voltage measured later, and determining whether the difference in the threshold voltages is larger than 2.5V;

as shown in FIG. 1, the difference in the threshold voltages reaches to 2.5V when the drain voltage is 3.6V, that is, the memory cell can be programmed normally when the drain voltage is 3.6V, and an erase operation is performed to the memory cell to drop the threshold voltage to the initial value, so as to ensure that subsequent programming operations may be performed at same voltage, thus improving the accuracy of the measurement; and next, programming the memory cell when the source and base are still grounded; a voltage of 10V is applied to the gate of the transistor in the memory, and the drain voltage is set to 3.8V, 4.0V, 4.2V and 4.4V, respectively; thus obtaining respective differences in the threshold voltages shown in FIG. 1 (as shown in FIG. 1, the memory cell can be programmed normally when the drain voltage is 3.8V, 4.0V, 4.2V and 4.4V); then, recording the five drain voltages of 3.6V, 3.8V, 4.0V, 4.2V and 4.4V and the source voltage, the grounded base and the gate voltage as the initial programming condition, that is, the initial programming condition including that the source and base of the transistor in the memory cell are grounded, a voltage of 10V is applied to the gate, and a voltage of 3.6V 3.8V, 4.0V, 4.2V and 4.4V is applied to the drain respectively.

In the second stage, the source voltage is selected from the initial programming condition as the variable.

In the third stage, the program disturb test is performed to the memory cell when the source voltage is set to floating, 1V, 1.5V and 2V respectively as shown in FIG. 6, in which:

Firstly, performing the programming operation to the memory cell and measuring and recording the program disturb when the source voltage is set to floating while other parameters in the initial programming condition are not changed, that is, the base is grounded, a voltage of 10V and with a pulse width larger than 2 μs is applied to the gate and a voltage of 3.6V and with a pulse width of 2 μs is applied to the drain; then, performing the programming operation to the memory cell and measuring and recording the program disturb when only the drain voltage is changed while other parameters are not changed, i.e., the source is floated, the base is grounded, a voltage of 10V and with a pulse width larger than 2 μs is applied to the gate but a voltage of 3.8V is applied to the drain; next, performing the programming operation to the memory cell and measuring and recording the program disturb when a voltage of 4.0V is applied to the drain; next, performing the programming operation to the memory cell and measuring and recording the program disturb when a voltage of 4.2V is applied to the drain; at last, performing the programming operation to the memory cell and measuring and recording the program disturb when a voltage of 4.4V is applied to the drain. Wherein, an erase operation has to be performed each time before the drain voltage is changed. Thus, the threshold voltage of the memory cell can be dropped to the initial value so as to ensure that each programming operation is performed at the same voltage to improve accuracy of the measurement.

Then, performing the programming operation to the memory cell and measuring and recording the program disturb when the source voltage is set to 1V while other parameters in the initial programming condition are not changed, that is, the base is grounded, a voltage of 10V and with a pulse width larger than 2 μs is applied to the gate and a voltage of 3.6V and with a pulse width of 2 μs is applied to the drain; then, performing the programming operation to the memory cell and measuring and recording the program disturb when only the drain voltage is changed while other parameters are not changed, i.e., the source voltage is floated, the base is grounded, a voltage of 10V and with a pulse width larger than 2 μs is applied to the gate but a voltage of 3.8V is applied to the drain; next, performing the programming operation to the memory cell and measuring and recording the program disturb when a voltage of 4.0V is applied to the drain; next, performing the programming operation to the memory cell and measuring and recording the program disturb when a voltage of 4.2V is applied to the drain; at last, performing the programming operation to the memory cell and measuring and recording the program disturb when a voltage of 4.4V is applied to the drain. Wherein, an erase operation has to be performed each time before the drain voltage is changed. Thus, the threshold voltage of the memory cell can be dropped to the initial value so as to ensure that each programming operation is performed at the same voltage to improve accuracy of the measurement.

Next, performing the programming operation to the memory cell and measuring and recording the program disturb when the source voltage is set to 1.5V while other parameters in the initial programming condition are not changed, that is, the base is grounded, a voltage of 10V and with a pulse width larger than 2 µs is applied to the gate and a voltage of 3.6V and with a pulse width of 2 µs is applied to the drain; then, performing the programming operation to the memory cell and measuring and recording the program disturb when only the drain voltage is changed while other parameters are not changed, i.e., the source is floated, the base is grounded, a voltage of 10V and with a pulse width larger than 2 µs is applied to the gate but a voltage of 3.8V is applied to the drain; next, performing the programming operation to the memory cell and measuring and recording the program disturb when a voltage of 4.0V is applied to the drain; next, performing the programming operation to the memory cell and measuring and recording the program disturb when a voltage of 4.2V is applied to the drain; at last, performing the programming operation to the memory cell and measuring and recording the program disturb when a voltage of 4.4V is applied to the drain. Wherein, an erase operation has to be performed each time before the drain voltage is changed. Thus, the threshold voltage of the memory cell can be dropped to the initial value so as to ensure that each programming operation is performed at the same voltage to improve accuracy of the measurement.

Next, performing the programming operation to the memory cell and measuring and recording the program disturb when the source voltage is set to 2V while other parameters in the initial programming condition are not changed, that is, the base is grounded, a voltage of 10V and with a pulse width larger than 2 µs is applied to the gate and a voltage of 3.6V and with a pulse width of 2 µs is applied to the drain; then, performing the programming operation to the memory cell and measuring and recording the program disturb when only the drain voltage is changed while other parameters are not changed, i.e., the source is floated, the base is grounded, a voltage of 10V and with a pulse width larger than 2 µs is applied to the gate but a voltage of 3.8V is applied to the drain; next, performing the programming operation to the memory cell and measuring and recording the program disturb when a voltage of 4.0V is applied to the drain; next, performing the programming operation to the memory cell and measuring and recording the program disturb when a voltage of 4.2V is applied to the drain; at last, performing the programming operation to the memory cell and measuring and recording the program disturb when a voltage of 4.4V is applied to the drain. Wherein, an erase operation has to be performed each time before the drain voltage is changed. Thus, the threshold voltage of the memory cell can be dropped to the initial value so as to ensure that each programming operation is performed at the same voltage to improve accuracy of the measurement.

At last, performing the programming operation to the memory cell and measuring and recording the program disturb when the source voltage is set to 3V while other parameters in the initial programming condition are not changed, that is, the base is grounded, a voltage of 10V and with a pulse width larger than 2 µs is applied to the gate and a voltage of 3.6V and with a pulse width of 2 µs is applied to the drain; then, performing the programming operation to the memory cell and measuring and recording the program disturb when only the drain voltage is changed while other parameters are not changed, i.e., the source is floated, the base is grounded, a voltage of 10V and with a pulse width larger than 2 µs is applied to the gate but a voltage of 3.8V is applied to the drain; next, performing the programming operation to the memory cell and measuring and recording the program disturb when a voltage of 4.0V is applied to the drain; next, performing the programming operation to the memory cell and measuring and recording the program disturb when a voltage of 4.2V is applied to the drain; at last, performing the programming operation to the memory cell and measuring and recording the program disturb when a voltage of 4.4V is applied to the drain. Wherein, an erase operation has to be performed each time before the drain voltage is changed. Thus, the threshold voltage of the memory cell can be dropped to the initial value so as to ensure that each programming operation is performed at the same voltage to improve accuracy of the measurement.

Figure 2:
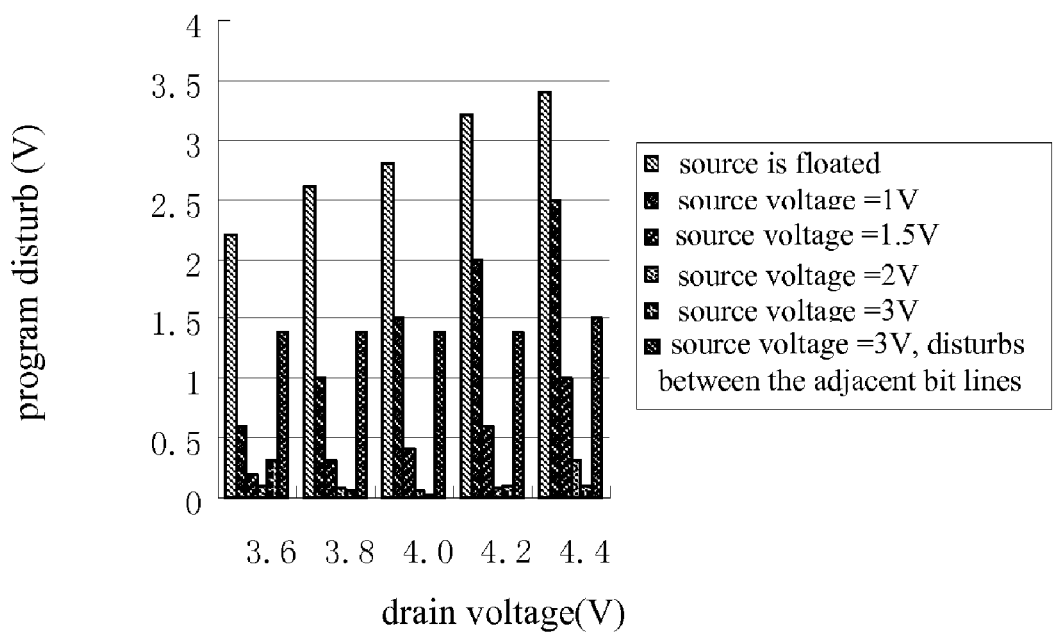
FIG. 2 is a histogram illustrating a tested relationship between the source voltage and the program disturb according an embodiment of the present invention.

FIG. 2 is a histogram illustrating the relationship between the source voltage and the program disturb when drain voltage is set to 3.6V, 3.8V, 4.0V, 4.2V, and 4.4V at the condition of the source voltage being set to floating, 1V, or 1.5V, 2V, and 3V, as described in paragraphs, and, respectively. As shown in FIG. 2, the program disturb increases with the drain voltage applied to the transistor in the memory cell, and decreases with the source voltage applied to the transistor in the memory cell. The voltage of the program disturb is lower than 0.5V when a voltage of 2V is applied to the source of the transistor in the memory cell. However, the program disturb between the adjacent bit lines becomes very high when the source voltage of the transistor in the memory cell increases to 3V continuously: the program disturbs between the adjacent bit lines measured when drain voltage is set to 3.6V, 3.8V, 4.0V, 4.2V, and 4.4V at the condition of the source voltage being set to 3V are also shown in FIG. 2. Thus, the program disturb has a minimum value when the source voltage is 2V while other parameters are not changed during programming the memory cell.

Then, returning to the second stage, the base voltage is selected from the initial programming condition as the variable.

The base voltage is set to −1V, 0V and 1V respectively.

The program disturb test is performed to the memory cell again.

Firstly, performing the programming operation to the memory cell and measuring and recording the program disturb when the base voltage is set to −1V while other parameters in the initial programming condition are not changed, that is, the source is grounded, a voltage of 10V and with a pulse width larger than 2 µs is applied to the gate and a voltage of 3.6V and with a pulse width of 2 µs is applied to the drain; then, performing the programming operation to the memory cell and measuring and recording the program disturb when only the drain voltage is changed while other parameters are not changed, i.e., the base voltage is −1V, the source is grounded, a voltage of 10V and with a pulse width larger than 2 µs is applied to the gate and a voltage of 3.8V is applied to the drain. Wherein, an erase operation has to be performed each time before the drain voltage is changed. Thus, the threshold voltage of the memory cell can be dropped to the initial value so as to ensure that each programming operation is performed at the same voltage to improve accuracy of the measurement.

Then, performing the programming operation to the memory cell and measuring and recording the program disturb when the base voltage is set to 0V while other parameters in the initial programming condition are not changed, that is, the source is grounded, a voltage of 10V and with a pulse width larger than 2 µs is applied to the gate and a voltage of 3.6V and with a pulse width of 2 µs is applied to the drain; then, performing the programming operation to the memory cell and measuring and recording the program disturb when only the drain voltage is changed while other parameters are not changed, i.e., the base voltage is 0V, the source is grounded, a voltage of 10V and with a pulse width larger than 2 μs is applied to the gate and a voltage of 3.8V is applied to the drain. Wherein, an erase operation has to be performed each time before the drain voltage is changed. Thus, the threshold voltage of the memory cell can be dropped to the initial value so as to ensure that each programming operation is performed at the same voltage to improve accuracy of the measurement.

Then, performing the programming operation to the memory cell and measuring and recording the program disturb when the base voltage is set to 1V while other parameters in the initial programming condition are not changed, that is, the source is grounded, a voltage of 10V and with a pulse width larger than 2 μs is applied to the gate and a voltage of 3.6V and with a pulse width of 2 μs is applied to the drain; then, performing the programming operation to the memory cell and measuring and recording the program disturb when only the drain voltage is changed while other parameters are not changed, i.e., the base voltage is 1V, the source is grounded, a voltage of 10V and with a pulse width larger than 2 μs is applied to the gate and a voltage of 3.8V is applied to the drain. Wherein, an erase operation has to be performed each time before the drain voltage is changed. Thus, the threshold voltage of the memory cell can be dropped to the initial value so as to ensure that each programming operation is performed at the same voltage to improve accuracy of the measurement.

Figure 3:
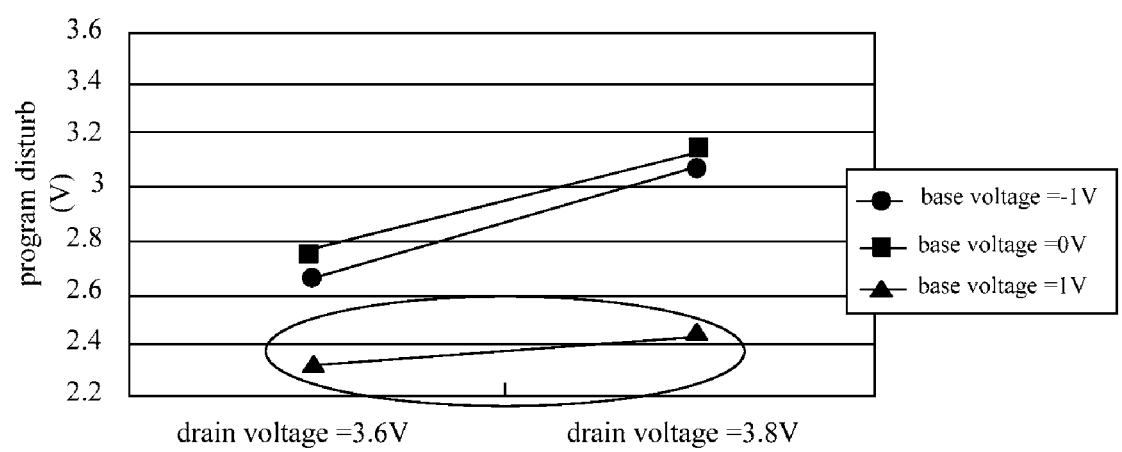
FIG. 3 is a diagram illustrating a tested relationship between the drain voltage and the program disturb according an embodiment of the present invention.

FIG. 3 is a diagram illustrating a tested relationship between the drain voltage and the program disturb where the base voltage is set to −1V, 0V and 1V at the conditions of the drain voltage being set to 3.6V and 3.8V, as described in paragraphs 63, 64 and 65, respectively. As shown in FIG. 3, the program disturb increases with the pulse voltage applied to the drain of the transistor in the memory cell, and decreases with the voltage applied to the base of the transistor in the memory cell. The voltage of the program disturb is lower than 2.4V when the base voltage is 1V. Thus, the program disturb is minimum when the base voltage of the transistor is 1V while other parameters are not changed during programming the memory cell.

In the fourth stage, the program disturb can be minimized by applying a voltage of 2V to the source of the transistor in the memory cell and a voltage of 1V to the base of the transistor in the memory cell during programming the memory cell based on the above result. Thus, the programming condition with minimum program disturb includes applying the voltage of 2V to the source and applying the voltage of 1V to the source.

In the fifth stage, the voltage of 2V is applied to the source and the voltage of 1V is applied to the base during programming the memory cell.

Hence, the program disturb is minimized by obtaining the programming condition with minimum program disturb based on the result of the program disturb test, and then applying the program disturb condition while keeping the memory cell programming normally; and the operation is easy since no additional control is required during the programming.

What is claimed is:

1. A method for decreasing program disturb in memory cells, comprising:
    finding an initial programming condition that ensures programming a memory cell normally;
    selecting one parameter from the initial programming condition as a variable for a program disturb test, said one parameter is selected as a source voltage or a base voltage;
    performing the program disturb test to the memory cell for at least two values of the variable;
    obtaining a programming condition having a minimum program disturb based on a result of the program disturb test; and
    applying the programming condition with the minimum program disturb as the programming condition during programming the memory cell.

2. The method according to claim 1, wherein the step of finding an initial programming condition that ensures programming the memory cell normally comprising:
    measuring an initial threshold voltage of a transistor in the memory cell;
    performing a programming operation to the memory cell by keeping a source and a base of the memory cell in the transistor being grounded, applying a voltage of 10V to a gate of the transistor in the memory cell and setting a drain voltage;
    measuring a threshold voltage of the transistor in the memory cell again;
    determining whether a difference between the initial threshold voltage and the threshold voltage measured later is larger than a nominal value of the transistor in the memory cell;
    performing an erase operation to the memory cell to drop the threshold voltage measured later of the transistor in the memory cell to the initial threshold voltage if the difference between the initial threshold voltage and the threshold voltage measured later is smaller than the nominal value and hence the memory cell is unable to be programmed normally, and then returning to the step of performing a programming operation to the memory cell;
    performing the erase operation to the memory cell to drop the threshold voltage measured later of the transistor in the memory cell to the initial threshold voltage if the drain voltage reaches the nominal value and hence the memory cell is able to be programmed normally; and
    recording at least two drain voltages, a source voltage, the source voltage, the base voltage and the gate voltage capable of programming the memory cell normally as the initial programming condition.

3. The method according to claim 2, wherein the nominal value is 2.5V.

4. The method according to claim 2, wherein the drain voltage capable of programming the memory cell normally is 3.6V, 3.8V, 4.0V, 4.2V and 4.4V.

5. The method according to claim 2, wherein the initial programming condition is as follows: the source and the base of the transistor in the memory cell are grounded, a voltage of 10V is applied to the gate, and a voltage of 3.6V, 3.8V, 4.0V, 4.2V and 4.4V is applied to the drain respectively.

6. The method according to claim 1 wherein the programming condition with minimum program disturb is a set of values corresponding to each parameter capable of minimizing the program disturb in the memory cell.

7. The method according to claim 1 wherein the source voltage is set to floating, 1V, 1.5V or 2V.

8. The method according to claim 1 wherein the base voltage is set to −1V, 0V or 1V.

* * * * *